United States Patent [19]

Mason

[11] 3,766,447

[45] Oct. 16, 1973

[54] HETEROEPITAXIAL STRUCTURE

[75] Inventor: Donald R. Mason, Indialantic, Fla.

[73] Assignee: Harris-Intertype Corporation, Cleveland, Ohio

[22] Filed: Oct. 20, 1971

[21] Appl. No.: 190,778

[52] U.S. Cl. ..... 317/235 R, 317/235 N, 317/235 F, 317/235 AC, 148/175

[51] Int. Cl. ........................ H01l 19/00, H05b 33/00

[58] Field of Search ................. 317/235 N, 235 AC, 317/234 S; 148/175

[56] References Cited

UNITED STATES PATENTS

| | | | |
|---|---|---|---|
| 3,433,684 | 3/1969 | Zanowick et al. | 148/33.4 |
| 3,102,828 | 9/1963 | Courvoisier | 117/227 |
| 3,615,855 | 10/1971 | Smith | 136/89 |
| 3,515,576 | 6/1970 | Manasevit | 117/106 |
| 3,414,434 | 12/1968 | Manasevit | 117/201 |
| 3,476,593 | 11/1969 | Lehrer | 117/201 |

*Primary Examiner*—Martin H. Edlow
*Attorney*—Donald R. Greene

[57] ABSTRACT

A process for producing light emitting diodes is disclosed. In the process a major planar surface of a single crystal silicon wafer is modified to acceptably match the crystallographic lattice constant of a preselected electroluminescent single crystal semiconductor, such as gallium phosphide. The preselected electroluminescent semiconductor material is then epitaxially deposited in single crystal form on the modified surface of the silicon wafer, a step which is not feasible without the modification of the silicon wafer surface. Preferably, the modification is achieved by epitaxially depositing a thin layer of semiconductor material whose lattice structure offers a substantially smaller disparity with the structure of the electroluminescent material than the existing disparity between the silicon wafer and the electroluminescent material.

4 Claims, 2 Drawing Figures

HETEROEPITAXIAL STRUCTURE

BACKGROUND OF THE INVENTION

1. Field

The invention disclosed and claimed herein is in the field of semiconductor devices and processes for their manufacture. Specifically the invention is directed toward the preparation of light emitting diodes (LEDs) and toward the structure of such diodes.

2. Prior Art

The capability of certain semiconductor materials such as gallium phosphide (GaP), gallium arsenide (GaAs), and gallium arsenide phosphide (GaAsP), when in p-n junction configuration, to emit visible light in certain regions of the spectrum at extremely low power dissipation levels would seemingly make these materials prime candidates for use in the production of solid state displays. However, pure electroluminescent materials of this type are expensive, being difficult and costly to produce in large single crystals which heretofore have been required for display devices, and therefore solid state displays consisting of these materials have found only limited use, existing principally as laboratory curiosities. Typically GaP and GaAs single crystals are grown in relatively small diameter form by the Bridgeman or Czochralski method, the crystals are thereafter sawed into wafers, and the same material of which the crystal is composed is ultimately epitaxially deposited in appropriately doped form and desired pattern on the wafer to provide a monolithic array of light emitting diodes.

Manifestly, it would be desirable to provide monolithic displays capable of functioning in an identical manner to those described above, but without need for the costly basic materials heretofore employed. It is the principal objective of the present invention to provide low cost monolithic semiconductor light emitting displays and processes for making such displays.

SUMMARY OF THE INVENTION

The crux of the invention is the epitaxial deposition of known electroluminescent semiconductor materials, such as GaP, GaAs, and GaAsP on substrates of different, less expensive crystalline materials. Preferably, substrates of single crystal silicon are used because the latter is comparatively less expensive than single crystal GaP, GaAs, or GaAsP, by a sufficiently large margin to justify widespread commercial use of LEDs, and because single crystal silicon is compatible with fabrication techniques for most present-day semiconductor devices, being the basic material for those devices. Despite the desirability of silicon there is nothing critical about its use as the substrate material, and it is contemplated that other materials of equal or lesser cost such as germanium, sapphire or spinel may be preferred for a specific application. Regardless of the material used for the substrate, however, if it differs from the material to be epitaxially deposited thereon there will usually be a considerable difference in the lattice constant of the two materials. By "considerable" is meant a lattice mismatch sufficiently great to preclude true epitaxial growth, in the sense of extension of the crystal lattice structure, of one material upon the other. Clearly, the resulting layer of electroluminescent material would be polycrystalline rather than monocrystalline in form, and hence would be unsuitable as an efficient light emitting diode structure.

According to an important aspect of the invention, then, the lattice constants of the substrate and the electroluminescent layers are artificially "matched," where necessary, by use of an intermediate layer or region between the two which is compatible with both. In the particular case of Si and GaP, for example, the lattice constant of Si is approximately 5.42 and that of GaP is approximately 5.45. The lattice mismatch is $(5.45 - 5.42)/5.42 \times 100 = 0.56$ percent, which is unacceptable for producing a heteroepitaxial structure. The angle of mismatch between the substrate and the epitaxial film, in this case is:

$$\theta = \cos^{-1}(5.42/5.45) = \cos^{-1} 0.995 = 5°40'.$$

Such a mismatch angle is too large for normal epitaxy. In a preferred embodiment of the invention the mismatch between Si and GaP is compensated by the use between the two of a graded alloy layer consisting of Si with a germanium (Ge) concentration ranging from zero at the junction with the Si substrate to about eight percent at the junction with the GaP layer. Here again, alternatives are available. Clearly, factors such as a reasonably close match between the thermal coefficients of linear expansion of the various layers, must be considered for any given case.

Figure 1:
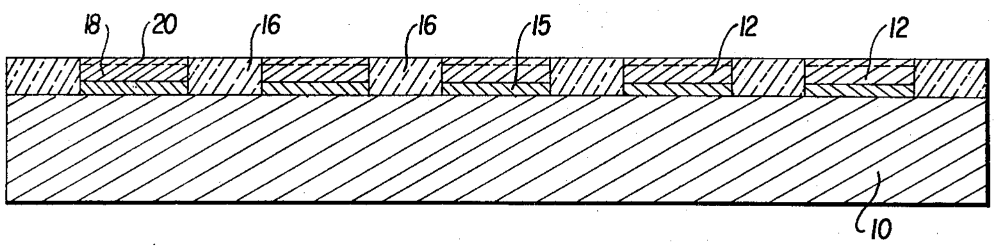
FIG. 1 is a cross-section of a monolithic heteroepitaxial LED array.

DESCRIPTION OF THE PREFERRED EMBODIMENT:

According to a preferred method of practicing the invention, a large diameter single crystal silicon wafer is used as the substrate. One or both major faces of the wafer are polished using standard techniques After polishing, the wafer is masked, as by oxidation, to form a silicon oxide-film on an exposed major surface. The desired light emitting diode pattern may then be provided in the mask using conventional protoresist and etch techniques. For example, an alphanumeric display consisting of a 5 × 7 dot matrix is conveniently formed by opening five columns and seven rows of apertures in the oxide mask layer. Of course, other LED pattern geometries and other dielectric or insulative layers (such as silicon oxynitride or silicon nitride) may be employed in the masking process.

A silicon-germanium (Si-Ge) alloy layer is now formed in each aperture on the major face of the Si wafer. This is one of the critical steps of the process in that the alloy or other intermediate material must be capable of forming a suitable junction between the substrate and the electroluminescent material, and must have a crystal lattice constant at its surface matching the lattice constant of the electroluminescent material. While Si-Ge alloy is preferred at this time, other materials may provide similar or perhaps even better results, and therefore the invention should not be considered as limited to any particular intermediate junction layer. The Si-Ge alloy is epitaxially deposited in a manner such that the initial coating on the silicon wafer face is substantially pure single crystal silicon and the germanium concentration is thereafter gradually increased from zero percent to about eight percent over a layer thickness of a few microns. This may be accomplished by vapor phase deposition, with hydrogen reduction of silicon tetrachloride (i.e., $SiCl_4$ in $H_2$) at about 1,200°C, adding germanium tetrachloride ($GeCl_4$) in gradually increasing amounts to produce the uniformly increasing concentration of Ge throughout the thickness of the Si-Ge alloy layer.

Rather than using hydrogen reduction of silicon tetrachloride, the epitaxial growth may be accomplished by thermal decomposition of silane ($SiH_4$) at a somewhat lower temperature (about 1,000°C), or by using $SiHCl_3$ with $GeCl_4$ added during the reaction process in amounts suitable to produce the graded junction (preferably uniformly varying concentration of Ge) Si-Ge alloy layer. Methods of epitaxial deposition of silicon and Si-X alloys are generally well known, and therefore the invention contemplates the use of any available process for accomplishing that result, without limitation.

Although a graded layer is preferred, as an alternative the Si-Ge alloy layer may simply contain a fixed low percentage of germanium, four to ten percent for example, in substantially uniform concentration throughout. In principle, neither the graded nor the uniformly low concentration alloy layer constitutes a step junction with the silicon wafer, nor between the single crystal silicon and the electroluminescent material ultimately deposited on the alloy layer. Instead, each may be validly considered as a linearly graded junction by which an appropriate match is provided between the lattice constant of the silicon wafer and the lattice constant of the electroluminescent layer.

In the formation of the Si-Ge alloy layer, the Si-Ge material deposits epitaxially in single crystal structure on the single crystal silicon wafer surface exposed in the mask apertures, and in polycrystalline structure on the oxide mask covering the remaining portions of the wafer surface. The polycrystalline material may be removed, by lapping, etching, or other conventional steps, before further processing, or it may be retained until additional steps of the overall process are completed. In any event, the desired electroluminescent layer may now be deposited epitaxially on the single crystal alloy layer since the latter provices a surface lattice constant matching the lattice constant of GaP.

GaP doped with Zn, O, and Te is epitaxially deposited as compensated p-type GaP, using separate vapors of elemental Ga in $PCl_3$, Zn, $H_2O$, and $H_2Te$, in the appropriate vapor phase concentrations to produce the single crystal GaP with the desired net doping. The $PCl_3$, $H_2O$ and $H_2Te$ are introduced into separate inlets of a mixing chamber at desired flow rates. The outlet of the mixing chamber is connected to the inlet of a reaction chamber containing hyperpure gallium and into which is also fed the zinc vapor of ultra high purity. Hydrogen may be used as the carrier gas. The reaction zone temperature is preferably maintained in the range from 750°C to 950°C, and the substrate (the silicon wafer with Si-Ge alloy layer deposited thereon in the mask apertures) is maintained at a temperature of from 650°C to 850°C. An epitaxial layer of GaP about 10 to 30 microns thick is grown on the single crystal Si-Ge alloy in the mask apertures to form the light emitting diode array. The formation of a p-n junction necessary for diode action in the GaP layer is conveniently achieved by heating the structure to a temperature in the range from 900°C to 1,000°C to induce out-diffusion of zinc ions from the surface of the GaP epitaxial layer, thereby producing an n-type surface region on the p-type material.

An array of LEDs in a monolithic display produced by the above process is shown in FIG. 1. The substrate comprises an appropriately doped single crystal silicon body 10 (here p-type, for example) constituting one of the dice of the original silicon wafer after processing. The electroluminescent areas of GaP are layers 12 separated from silicon body 10 by intermediate lattice constant matching layers 15. Each of the latter is a graded layer of silicon-germanium alloy (here doped p-type for example) in which the germanium concentration increases to a percentage of under 10 percent, in the manner described above. Layers 12 are separated from each other by insulative or dielectric passivating regions 16 atop silicon body 10. Usually, these passivating regions comprise silicon dioxide. Each of the electroluminescent layers constitutes a separate and distinct light emitting diode with a shallow p-n junction between p-region 18 (in this example) and n-region 20. The thickness of the various layers and regions are intentionally exaggerated in FIG. 1 for the sake of clarity. Metallization patterns (not shown) for interconnecting the diodes with appropriate drive and/or decode circuitry may be laid down as an adherent aluminum film on the structure, which may also include an additional passivation layer. Obviously, in any desired arrangement at least a substantial portion of the electroluminescent material is left exposed to exhibit emission of light when energized.

Figure 2:
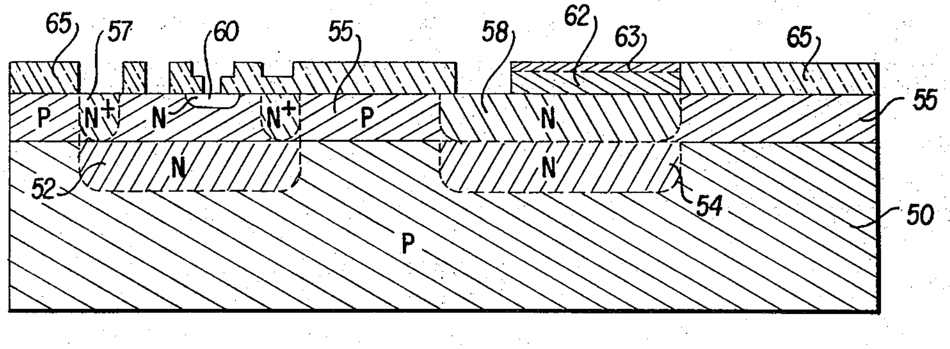
FIG. 2 is a cross-section of a heteroepitaxial LED in integrated circuit with a bipolar transistor.

The silicon body and/or the silicon-germanium layer may contain active or passive components formed therein using conventional techniques, to provide an integrated circuit. A portion of such an integrated circuit is shown in FIG. 2. In the formation of this structure a p-type single crystal silicon substrate 50, after polishing of one or both its major faces, is subjected to oxidation to form an oxide layer mask thereon. Apertures are opened in the mask by standard photoresist-etch techniques, as required for the provision of active components (such as transistors), passive components, and alphanumeric character elements (i.e., LEDs). In the device shown in FIG. 2, diffusion of n-type impurities is employed to form the transistor collector region 52 and the character "tub" 54. After an oxide strip and clean operation, the lattice constant matching layer 55 consisting of p-type Si-Ge of the uniformly graded type as described above is epitaxially deposited on the surface of silicon body 50. The entire body is again subjected to oxidation and opening of apertures in the oxide mask for $n^+$ diffusion to form isolation (p-n junction isolation) ring 57 and additional character tub 58. After further masking the transistor emitter region 60 is formed by another $n^+$ diffusion into layer 55.

The surface is again masked and LED matrix apertures are opened for epitaxial deposition of n-type GaP layer 62 onto Si-Ge layer 55 via the apertures. A p-type surface diffusion into layer 62 provides a p-region 63 for creating the desired p-n junction for diode action. Finally, a protective coating 65 is deposited on the device and apertures are opened for application of contacts and interconnection through a metallization layer.

Again, while the use of a single crystal semiconductor as the substrate is preferred, to allow incorporation of components of the drive and decode circuit in monolithic form, other single crystal materials such as sapphire or spinel may alternatively be employed as the substrate.

What is claimed is:

1. A light emitting diode structure, comprising a single crystal silicon substrate, a layer of single crystal semiconductor material consisting essentially of a Group III-V compound, said layer containing a p-n junction for emission of light in response to electrical energization thereof, said single crystal layer having a crystal lattice constant which differs from the crystal lattice constant of said single crystal substrate, said single crystal layer superposed on said substrate, and a graded layer of single crystal semiconductor material interposed between and in adherent contact with said substrate and the first-named single crystal layer, said graded layer consisting of an alloy of silicon and germanium in which the germanium concentration varies from approximately zero mole percent at the boundary with said substrate to approximately ten mole percent at the boundary with said first-named single crystal layer, said graded layer having a crystal lattice constant substantially matching the crystal lattice constant of said substrate at the boundary therebetween and having a crystal lattice constant substantially matching the crystal lattice constant of said first-named single crystal layer at the boundary therebetween.

2. The light emitting diode structure according to claim 1, wherein said Group III-V compound is selected from the group consisting of GaP, GaAs, and GaAsP.

3. A monolithic light emitting diode display, comprising a single crystal silicon substrate, a plurality of spaced-apart semiconductor p-n junction regions, each p-n junction region consisting of a single crystal layer, each said single crystal layer consisting essentially of a Group III-V compound for emission of light in response to electrical energization of the respective p-n junction, each said single crystal layer superposed on said substrate and having a crystal lattice constant different from the crystal lattice constant of said substrate, and a graded layer of single crystal semiconductor material interposed between and in adherent contact with each said first-named single crystal layer and said substrate ,said graded layer consisting of an alloy of silicon and germanium in which the germanium concentration varies from approximately zero mole percent at the boundary with said substrate to approximately ten mole percent at the boundary with each said first-named single crystal layer, said graded layer having a crystal lattice constant substantially matching the crystal lattice constant of said substrate at the boundary therebetween and having a crystal lattice constant substantially matching the crystal lattice constant of the respective first-named single crystal layer at the boundary therebetween.

4. The monolithic light emitting diode display according to claim 3, wherein said Group III-V compound is selected from the group consisting of GaP, GaAs, and GaAsP.

* * * * *